(12) United States Patent
Acosta et al.

(10) Patent No.: US 11,791,575 B2
(45) Date of Patent: Oct. 17, 2023

(54) CIRCUIT BOARD WITH U-SHAPED ELECTRICAL TERMINAL

(71) Applicant: Aptiv Technologies (2) S.à r.l., Luxembourg (LU)

(72) Inventors: Erick Adrian Rodriguez Acosta, Quintas del Valle (MX); Naiki Alejandra Reynoso Galvan, Sterling Heights, MI (US)

(73) Assignee: Aptiv Technologies (2) S.à r.l., Luxembourg (LU)

( * ) Notice: Subject to any disclaimer, the term of this patent is extended or adjusted under 35 U.S.C. 154(b) by 52 days.

(21) Appl. No.: 17/474,341

(22) Filed: Sep. 14, 2021

(65) Prior Publication Data
US 2023/0081049 A1    Mar. 16, 2023

(51) Int. Cl.
*H01R 12/58* (2011.01)
(52) U.S. Cl.
CPC .................................. *H01R 12/585* (2013.01)
(58) Field of Classification Search
CPC ...................................................... H01R 12/585
USPC ................................................................ 174/250
See application file for complete search history.

(56) References Cited

U.S. PATENT DOCUMENTS

| 7,347,738 | B2 | 3/2008 | Hsieh et al. |
| 8,556,666 | B2* | 10/2013 | Brandon ................. H01R 12/58 |
| | | | 439/857 |
| 10,250,002 | B2 | 4/2019 | Ishikawa et al. |
| 10,446,944 | B1 | 10/2019 | Beckert et al. |
| 10,530,085 | B2 | 1/2020 | Mitsui |
| 2007/0243770 | A1* | 10/2007 | Hsieh ................. H01R 13/4361 |
| | | | 439/701 |
| 2020/0259287 | A1 | 8/2020 | Tristani et al. |

* cited by examiner

*Primary Examiner* — Andargie M Aychillhum
(74) *Attorney, Agent, or Firm* — Billion & Armitage

(57) ABSTRACT

A circuit board assembly includes a circuit board substrate defining an aperture extending therethrough and configured to accept a planar male terminal from a first side of the circuit board substrate. The assembly further includes a female terminal extending from a second side of the circuit board substrate opposite the first side that defines a slot in a U-shaped portion on the second side of the circuit board substrate. The slot has an open end and a closed end. The slot is sized and arranged to receive the male terminal extending through the aperture be in an interference fit with the male terminal. The female terminal has a pair of tines, each tine having a fixed end attached to a base portion and a free end. The free end of one of the tines is disposed within a mounting hole in the circuit board substrate located adjacent the aperture.

18 Claims, 5 Drawing Sheets

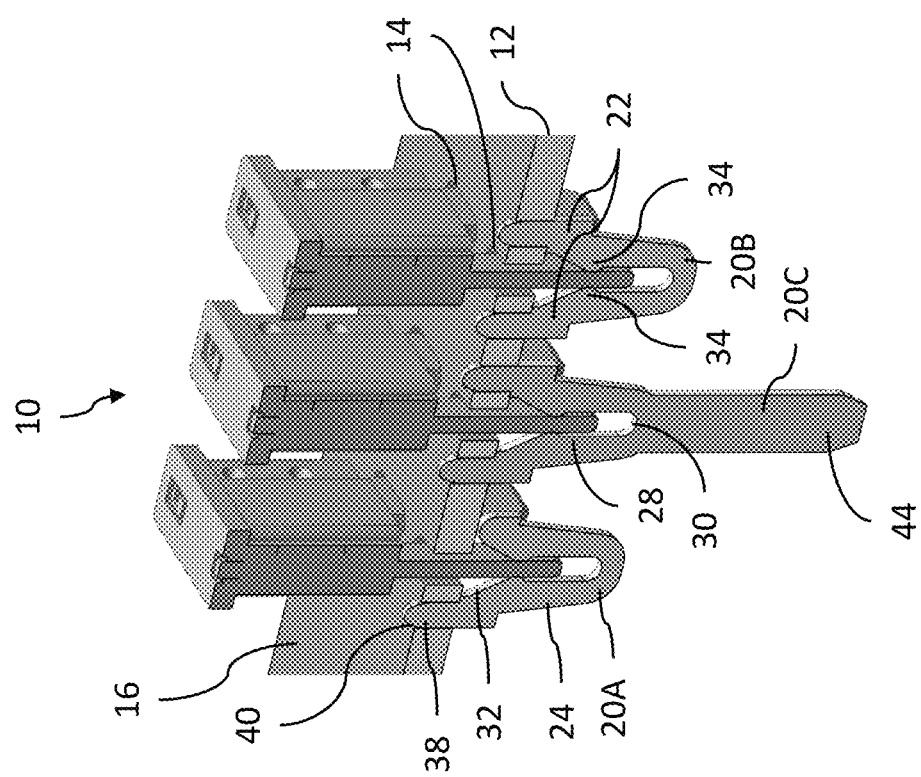
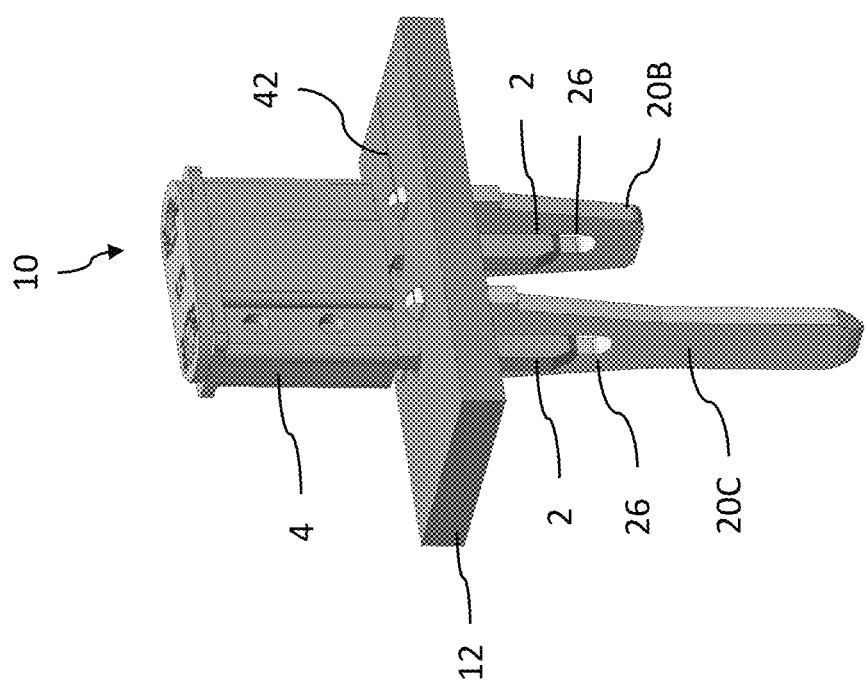
Fig. 1B
Fig. 1A

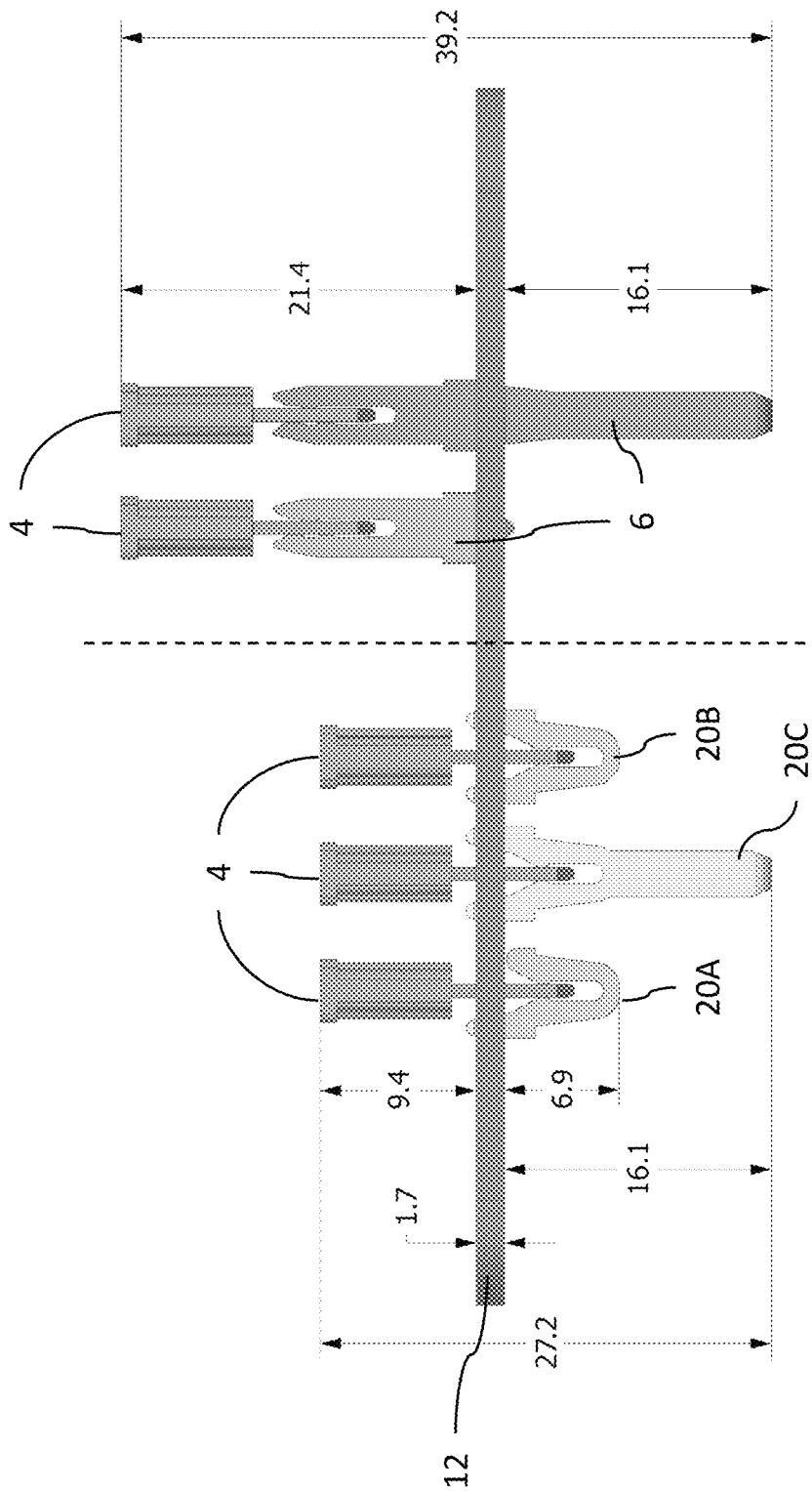

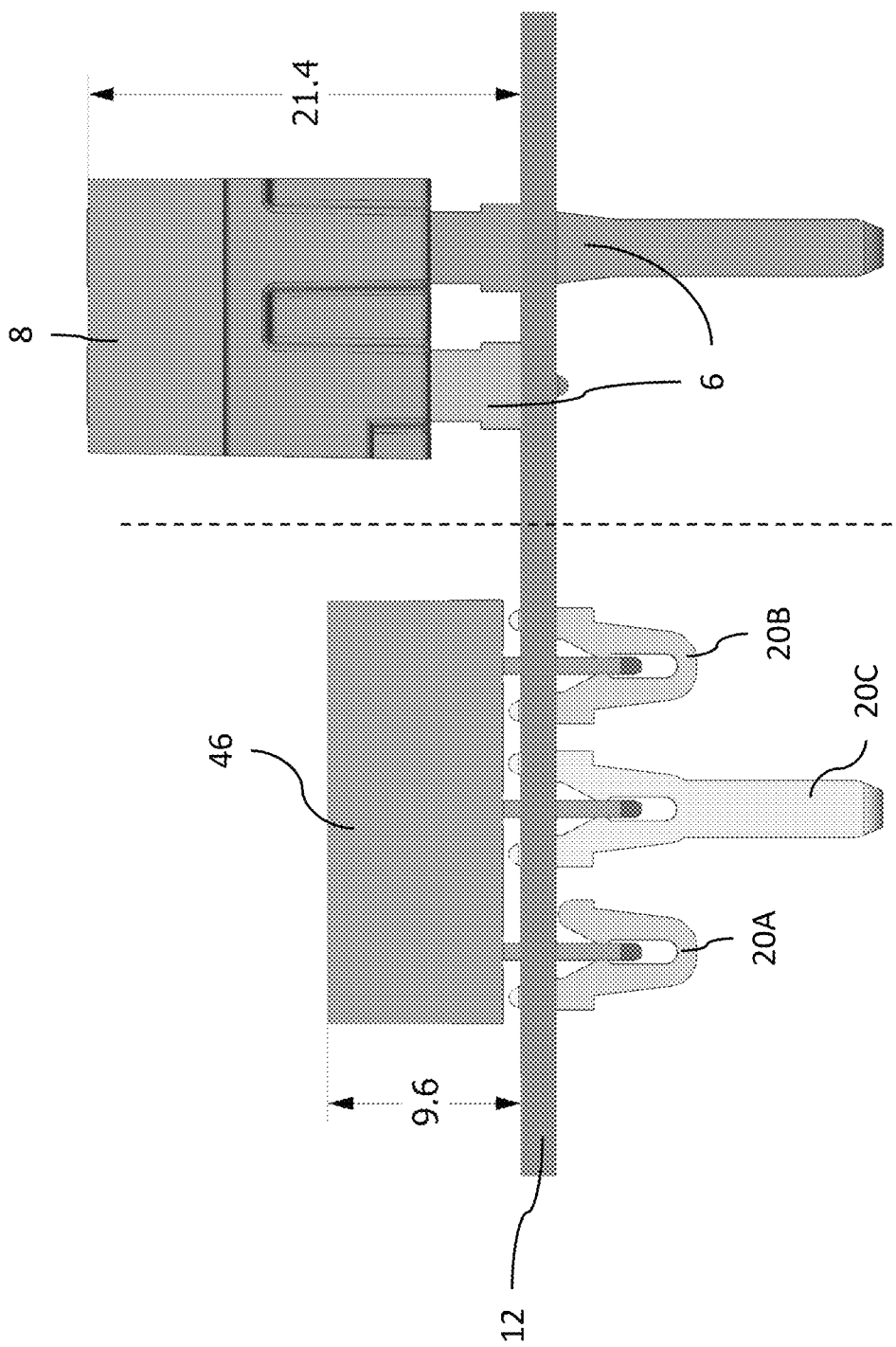

CIRCUIT BOARD WITH U-SHAPED ELECTRICAL TERMINAL

This patent application is directed to circuit boards having electrical terminals and more particularly to a circuit board having a U-shaped electrical terminal that is configured for pluggable device insertion through a circuit board substrate.

BACKGROUND

A tuning fork terminal is an electrical terminal designed to produce normal forces on the surfaces of a mating blade which is inserted between and simultaneously deflects due to designed interferences.

Tuning fork terminals are a robust and low cost means to make electrical contact with circuit protection device blades and switching device blades in electrical power distribution centers in motor vehicles. Tuning forks terminals have been used in routed wire electrical centers with integrated insulation displacement crimps and in printed circuit board (PCB) based electrical centers. They can be integrated with other geometries, for example tuning forks have been integrated into bus bars, with blades and with stubs that can be stitched into PCBs or stamped metal.

Today, tuning fork terminals face different challenges, especially in a manufacturing environment. Alignment between tuning fork terminals, upper housing electrical center housings and electrical devices has become a recurrent problem since the tuning fork terminals need to be assembled between the upper and lower electrical center housings, which sometimes lead to tuning fork terminal damage in this process since this is typically a manual operation.

SUMMARY

According to one or more aspects of the present disclosure, a circuit board assembly includes a circuit board substrate. The circuit board substrate defines at least one aperture extending therethrough. The aperture is configured to accept a planar male terminal inserted therein from a first side of the circuit board substrate. The assembly further includes a planar female terminal that extends from a second side of the circuit board substrate located opposite the first side. The female terminal defines a slot in a U-shaped portion located on the second side of the circuit board substrate. The slot has an open end and a closed end. The slot is sized and arranged to receive the male terminal as it extends through the aperture. The male blade terminal is an interference fit with the slot.

In one or more embodiments of the assembly according to the previous paragraph, the female terminal is formed from an unbent sheet of metal.

In one or more embodiments of the assembly according to any one of the previous paragraphs, a major surface of the female terminal is arranged perpendicularly to a major surface of the male terminal.

In one or more embodiments of the assembly according to any one of the previous paragraphs, the female terminal is affixed to the circuit board substrate by a lance extending from the female terminal. The lance is located on one side of the slot and is inserted within a mounting hole in the circuit board substrate that is located adjacent the aperture.

In one or more embodiments of the assembly according to any one of the previous paragraphs, the lance is mechanically and electrically interconnected to a conductive trace on the circuit board substrate.

In one or more embodiments of the assembly according to any one of the previous paragraphs, the female terminal is affixed to the circuit board substrate by a single lance extending from the female terminal on only one side of the slot.

In one or more embodiments of the assembly according to any one of the previous paragraphs, the female terminal is affixed to the circuit board substrate by a pair of lances extending from the female terminal on two sides of the slot. The pair of lances are inserted within a pair of mounting holes in the circuit board substrate located on two sides of the aperture.

In one or more embodiments of the assembly according to any one of the previous paragraphs, a width of the closed end of the slot is greater than a width of the open end of the slot.

In one or more embodiments of the assembly according to any one of the previous paragraphs, a second male terminal extends from the female terminal in a direction opposite the slot.

In one or more embodiments of the assembly according to any one of the previous paragraphs, a width of a portion of the slot is less than a width of the open end of the slot.

According to one or more aspects of the present disclosure, a circuit board assembly includes a circuit board substrate defining an aperture extending therethrough. The aperture is configured to accept a planar male terminal inserted from a first side of the circuit board substrate. The assembly also includes a forked female terminal having a pair of tines. Each tine has a free end and a fixed end that is attached to a base portion. The pair of tines define a slot therebetween. The slot has an open end and a closed end. The slot is sized and arranged to receive the male terminal as it extends through the aperture and provide to an interference fit with the male terminal. The free end of one of the tines is disposed within a mounting hole in the circuit board substrate that is located adjacent the aperture.

In one or more embodiments of the assembly according to the previous paragraph, the free end of each of the tines is disposed within one mounting hole of a pair of mounting holes in the circuit board substrate that are located on two sides of the aperture.

In one or more embodiments of the assembly according to any one of the previous paragraphs, the female terminal is formed from an unbent sheet of metal.

In one or more embodiments of the assembly according to any one of the previous paragraphs, a major surface of the female terminal is arranged perpendicularly to a major surface of the male terminal.

In one or more embodiments of the assembly according to any one of the previous paragraphs, the female terminal is affixed to the circuit board substrate by a lance extending from the free end of the tine.

In one or more embodiments of the assembly according to any one of the previous paragraphs, the lance is mechanically and electrically interconnected to a conductive trace on the circuit board substrate.

In one or more embodiments of the assembly according to any one of the previous paragraphs, the female terminal is affixed to the circuit board substrate by a single lance.

In one or more embodiments of the assembly according to any one of the previous paragraphs, a width of the closed end of the slot is greater than a width of the open end of the slot.

In one or more embodiments of the assembly according to any one of the previous paragraphs, a second male terminal extends from the base portion.

In one or more embodiments of the assembly according to any one of the previous paragraphs, a width of a portion of the slot is less than a width of the open end of the slot.

DESCRIPTION OF THE DRAWINGS

The present invention will now be described, by way of example with reference to the accompanying drawings, in which:

FIGS. 1A and 1B is top perspective views of a circuit board assembly according to according to some embodiments;

FIGS. 4A and 4B is a side view of a circuit board assembly having terminals according to some embodiments in FIG. 4A compared to terminals according to the prior art in FIG. 4B; and FIGS. 5A and 5B is a side view of a circuit board assembly having terminals to according to some embodiments connected to components in FIG. 5A compared to terminals according to the prior art connected to components in FIG. 5B.

DETAILED DESCRIPTION

Figures 2A, 2B:
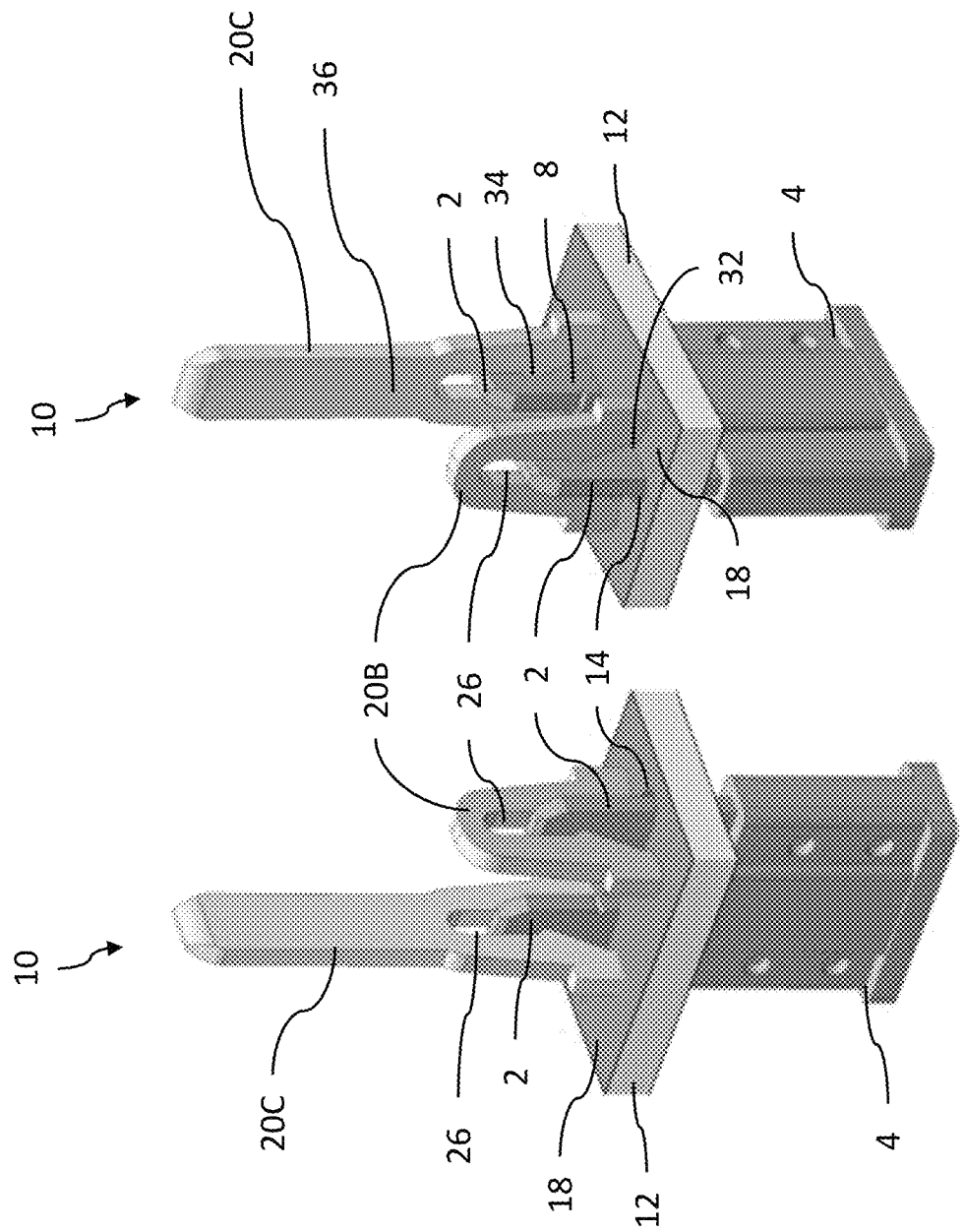
FIGS. 2A and 2B are bottom perspective views of the circuit board assembly according to according to some embodiments.

A test apparatus and testing method that overcomes the drawbacks of previous means for high voltage insulation tests is presented herein.

The present invention is inspired by a constant reduction in vehicle packaging space for components, such as electrical distribution centers, and damage to tuning fork style terminals that occur during the final processes of assembling such electrical distribution centers. A redesign of the tuning fork interface provides a U-shaped tuning fork located under a printed circuit board that requires less packaging space, is more resistant to damage caused during terminal mating, and can still retains the basic features of a tuning fork terminal. This new design of the female terminal also requires less material to manufacture than the typical tuning fork female terminal designs.

A circuit board assembly 10 illustrate in FIGS. 1A-2B includes a printed circuit board substrate, hereinafter referred to as the PCB 12 in which a number of holes or apertures 14 are formed and through which a male blade terminal 2, e.g., a male terminal of a fuse assembly 4, is received as it passed from the top side 16 of the PCB 12 to the bottom side 18. The PCB 12 is formed of epoxy or polyimide resins. The resin may be reinforced with a woven glass cloth or other matrix such as chopped fibers. Substrates formed of such materials are typically referred to as FR-4 or G-10 type circuit boards. The PCB 12 may alternatively be constructed of ceramic or rigid polymer materials. This listing of acceptable substrate materials is not exhaustive and other materials may also be used successfully. A layer of conductive material, such as a copper-based material is electroplated on at least one major surface of the PCB 12. The layer of conductive material is then formed to create power and ground circuit traces.

The circuit board assembly 10 also includes a number of female terminals 20A, 20B, 20C, generically referred to herein as the female terminal 20, that are attached or mounted to the bottom side 18 of the PCB 12 so that they extend from the bottom side 18 rather than the top side 16. The female terminal 20 is based on a tuning fork terminal and has a pair of times 22 that form a U-shaped portion 24 defining a slot 26 therein. The slot 26 has an open end 28 and a closed end 30. The slot 26 is arranged in the aperture 14 to receive the male terminal 2 as it extends through the aperture 14 in the PCB 12. The slot 26 is also sized so that it is in an interference fit with the male terminal 2. The female terminal 20 also has a tapered opening 32 leading to the open end 28 of the slot 26 that is designed to guide the male terminal 2 into the slot 26. The female terminal 20 also includes contact bumps 34 that extend into the slot 26 from each side forming a contact portion of the slot that has a width W1 that is less than a width W2 of the open end 28 of the slot 26. These contact bumps 34 provide a robust electrical contact between the female and male terminals 2, 20. The contact bumps 34 may include two bumps, one on each tine that are arranged opposite each other as best shown in FIG. 1B. Alternatively, the contact bumps 34 may include three contact bumps, two bumps projecting from one of the tines and one bump projection from the other tine and arranged intermediate the two bumps.

In contrast to a typical tuning fork terminal design of FIG. 4B, the female terminal 20 is mounted on the PCB 12 on the bottom side 18 of the PCB 12 that is opposite the insertion side which in the illustrated examples is the top side 16. As can be seen comparing the female terminals 20 of FIG. 4A to the tuning fork terminals 6 of FIG. 4B, the female terminal 20 is mounted on the bottom side 18 while the male terminal 2 is inserted from the top side 16 in contrast to the tuning fork terminal 6 of FIG. 4B which is mounted on the top side 16 of the PCB 12 and the male terminal 2 is inserted into the tuning fork terminal 4 from the same top side 16 of the PCB 12.

The female terminal 20 is formed from an unbent sheet of metal. This allows the female terminal 20 to be formed from flat sheet metal stock using a stamping or blanking process without the need for any further metal forming processes, such as bending or folding. This simplifies the manufacturing process and reducing manufacturing costs for the female terminal 20.

In order for the male blade terminal 2 to be properly received in the slot 26 in the female terminal 20, a major surface 36 of the female terminal 20 is arranged perpendicularly to a major surface 8 of the male blade terminal 2 when the male blade terminal 2 is received within the slot 26, see FIGS. 2A and 2B. As used herein, a major surface is the surface of the terminal having the largest surface area.

As shown in FIGS. 1B and 3A-3C, there may be several different embodiments of the female terminal 20. In each of these embodiments, the female terminal 20 is affixed to the PCB 12 by a tab or lance 38 that extends from the female terminal 20 on a side of the slot 26. The lance 38 is inserted within a mounting hole 40 in the PCB 12 that is located adjacent to the aperture 14 in the PCB 12. The lance 38 and the mounting hole 40 are sized so that the lance 38 and mounting hole 40 are in a press fit or interference fit condition to secure the female terminal 20 to the PCB 12. The lance 38 is electrically interconnected to an electrically conductive circuit trace 42 on the PCB 12, e.g., by a soldering process, to electrically interconnect the female terminal 20 to the circuit trace 42, see FIG. 1A.

Figure 3A:
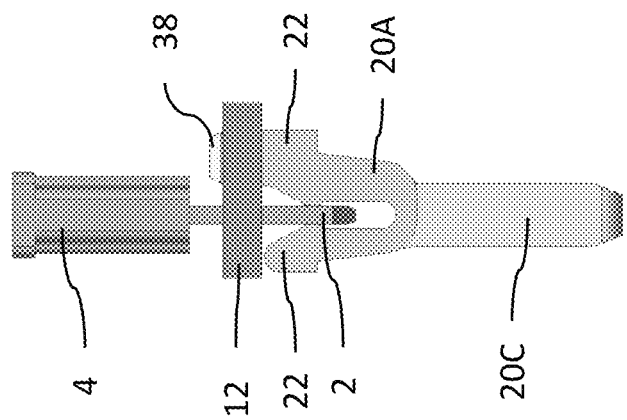
FIG. 3A is a right-side view of the circuit board assembly according to some embodiments.

In in a first embodiment of the female terminal 20A shown in FIG. 3A, the female terminal 20A is affixed to the PCB 12 by a single lance 38 extending from the female terminal 20A on only one side of the slot 26.

Figures 3B, 3C:
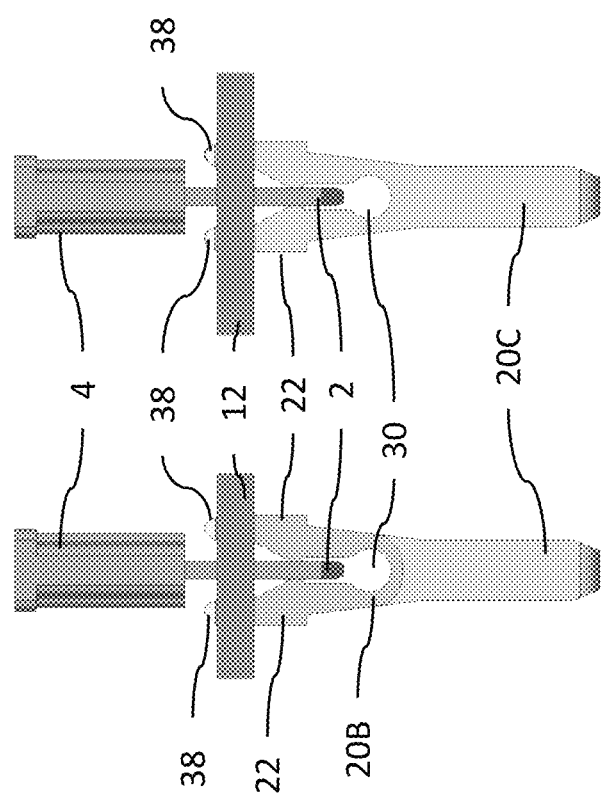
FIGS. 3B and 3C are right-side and left-side views of the circuit board assembly according to some embodiments.

In the second and third embodiments of the female terminal 20B, 20C shown in FIGS. 3B and 3C, the female terminals 20B. 20C are affixed to the PCB 12 by a pair of lances 38 extending from the female terminals 20B. 20C on two sides of the slot 26 and inserted within a pair of mounting holes 40 in the PCB 12 located on two sides of the aperture 14. As can be seen in FIGS. 3B and 3C, a width of the closed end 30 of the slot 26 is greater than a width of the open end 28 of the slot 26, such that the closed end 30 forms a generally circular shape. Without subscribing to any particular theory of operation, this circular shapes helps to reduce strain produced in the female terminals 20B, 20C while the male terminal 2 is being inserted into the slot 26. The circular closed end 30 increases the surface on the inside of the slot 26 and more widely distributes the strain during the male terminal insertion process, thereby reducing the maximum strain level in any particular location in the slot 26.

As shown in FIG. 3C, the third embodiment of the female terminal 20C also has a second male terminal 44 that extends from the female terminal 20C in a direction opposite the slot 26.

By "bottom mounting" the female terminals 20 as shown in FIG. 4A, the height of an electrical connection can be reduced by over 30% compared to the "top mounted" tuning fork terminals 4 shown in FIG. 4B. This reduction in height of the connection also provides a reduced height requirement for an electrical distribution center housing 46 covering the female terminals 20, compared to the electrical distribution center housing 9 covering the tuning fork terminals 6 see FIGS. 5A and 5B. In addition to requiring less packaging volume for the electrical distribution center, the female terminals 20 also allow a reduction in the volume of material needed to manufacture the electrical distribution center housing by up to 47%, compare FIGS. 5A and 5B, thereby providing material cost savings. In addition, the female terminals 20 in FIG. 4A requires up to 57% less sheet metal material to produce compared than the "top mounted" tuning fork 4 terminals shown in FIG. 4B which provides additional material cost savings.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention is not limited to the disclosed embodiment(s), but that the invention will include all embodiments falling within the scope of the appended claims.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

The invention claimed is:

1. A circuit board assembly, comprising:
a circuit board substrate defining an aperture extending therethrough and configured to accept a planar male terminal from a first side of the circuit board substrate; and
a planar female terminal extending from a second side of the circuit board substrate opposite the first side, the female terminal defining a slot in a U-shaped portion on the second side of the circuit board substrate, the slot having an open end and a closed end, the slot being arranged to receive the male terminal from the first side of the circuit board substrate extending through the aperture, wherein a width of a portion of the slot is less than a width of the open end of the slot due to contact bumps extending into the slot from both sides of the U-shaped portion.

2. The circuit board assembly according to claim 1, wherein the female terminal is formed from an unbent sheet of metal.

3. The circuit board assembly according to claim 1, wherein a major surface of the female terminal is arranged perpendicularly to a major surface of the male terminal.

4. The circuit board assembly according to claim 1, wherein the female terminal is affixed to the circuit board substrate by a lance extending from the female terminal on one side of the slot and inserted within a mounting hole in the circuit board substrate located adjacent the aperture.

5. The circuit board assembly according to claim 4, wherein the lance is mechanically and electrically interconnected to a conductive trace on the circuit board substrate.

6. The circuit board assembly according to claim 4, wherein the female terminal is affixed to the circuit board substrate by a single lance extending from the female terminal on only one side of the slot.

7. The circuit board assembly according to claim 1, the female terminal is affixed to the circuit board substrate by a pair of lances extending from the female terminal on two sides of the slot and inserted within a pair of mounting holes in the circuit board substrate located on two sides of the aperture.

8. The circuit board assembly according to claim 7, wherein a second male terminal extends from the female terminal in a direction opposite the slot.

9. The circuit board assembly according to claim 1, wherein the closed end of the slot defines a circular shape having a diameter greater than a width of the open end of the slot.

10. A circuit board assembly, comprising:
a circuit board substrate defining an aperture extending therethrough and configured to accept a planar male terminal from a first side of the circuit board substrate; and
a forked female terminal having a pair of tines, each tine having a fixed end attached to a base portion and a free end, the pair of tines defining a slot therebetween having an open end and a closed end, the slot being arranged to receive the male terminal from the first side of the circuit board substrate extending through the aperture, wherein a width of a portion of the slot is less than a width of the open end of the slot due to contact bumps extending into the slot from both of the tines and wherein the free end of one of the tines is disposed within a mounting hole in the circuit board substrate located adjacent the aperture.

11. The circuit board assembly according to claim 10, wherein the free end of each of the tines is disposed within one mounting hole of a pair of mounting holes in the circuit board substrate located on two sides of the aperture.

12. The circuit board assembly according to claim 10, wherein the female terminal is formed from an unbent sheet of metal.

13. The circuit board assembly according to claim 10, wherein a major surface of the female terminal is arranged perpendicularly to a major surface of the male terminal.

14. The circuit board assembly according to claim 10, wherein the female terminal is affixed to the circuit board substrate by a lance extending from the tine.

15. The circuit board assembly according to claim 14, wherein the lance is mechanically and electrically interconnected to a conductive trace on the circuit board substrate.

16. The circuit board assembly according to claim 14, wherein the female terminal is affixed to the circuit board substrate by a single lance.

17. The circuit board assembly according to claim 10, wherein the closed end of the slot defines a circular shape having a diameter greater than a width of the open end of the slot.

18. The circuit board assembly according to claim 10, wherein a second male terminal extends from the base portion.

\* \* \* \* \*